(12) United States Patent
Govil et al.

(10) Patent No.: US 6,747,492 B2
(45) Date of Patent: Jun. 8, 2004

(54) POWER-ON RESET CIRCUIT WITH CURRENT SHUT-OFF AND SEMICONDUCTOR DEVICE INCLUDING THE SAME

(75) Inventors: Alok Govil, Sleepy Hollow, NY (US); Vickram Vathulya, Ossining, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/174,320

(22) Filed: Jun. 18, 2002

(65) Prior Publication Data

US 2003/0231035 A1 Dec. 18, 2003

(51) Int. Cl.[7] .................. H03K 17/22; H03K 5/153
(52) U.S. Cl. ......................... 327/143; 327/198
(58) Field of Search .................. 327/142, 143, 327/198, 205; 326/94

(56) References Cited

U.S. PATENT DOCUMENTS

| | | | |
|---|---|---|---|
| 4,885,476 A | 12/1989 | Mahabadi | 327/143 |
| 5,323,067 A | 6/1994 | Shay | 327/142 |
| 5,442,312 A * | 8/1995 | Walter | 327/198 |
| 5,485,074 A * | 1/1996 | Tomasini et al. | 323/315 |
| 5,523,709 A * | 6/1996 | Phillips et al. | 327/143 |
| 5,565,807 A | 10/1996 | Ward | 327/205 |
| 5,929,673 A | 7/1999 | Haigis et al. | 327/143 |
| 5,933,036 A | 8/1999 | Kim | 327/143 |
| 5,936,444 A | 8/1999 | Pathak et al. | 327/143 |
| 6,005,423 A * | 12/1999 | Schultz | 327/143 |
| 6,052,006 A * | 4/2000 | Talaga, Jr. et al. | 327/143 |
| 6,085,327 A * | 7/2000 | Seng et al. | 327/143 |
| 6,127,852 A * | 10/2000 | Ogawa et al. | 327/50 |
| 6,144,238 A | 11/2000 | Dasgupta | 327/143 |
| 6,147,516 A | 11/2000 | Chang | 327/62 |
| 6,288,584 B1 | 9/2001 | Wu et al. | 327/143 |

\* cited by examiner

Primary Examiner—Timothy P. Callahan
Assistant Examiner—Terry L. Englund (57) ABSTRACT

A power-on reset circuit input stage includes a current source charging a capacitor from a first power supply voltage to produce a reset signal, and a current shutoff means for shutting off the current source when the reset signal reaches a desired threshold voltage (i.e., when the capacitor is charged up). Beneficially, the current shutoff means comprises a transistor connected between the current source and a second power supply voltage. Advantageously, the transistor is controlled by a feedback voltage that may be the output signal, or a voltage derived from the output signal by a capacitive divider, for example.

31 Claims, 7 Drawing Sheets

POWER-ON RESET CIRCUIT WITH CURRENT SHUT-OFF AND SEMICONDUCTOR DEVICE INCLUDING THE SAME

TECHNICAL FIELD

This invention pertains to the field of digital circuits, and more particularly, to a power-on reset circuit for a digital circuit, and a semiconductor device including the same.

BACKGROUND AND SUMMARY

When a power supply voltage is turned on, to be supplied to a digital circuit (such as a memory circuit), there is a period of time necessary for the power supply voltage to ramp-up to its final (steady-state) value and stabilize. If the power supply voltage is applied to the digital circuit during this ramp-up period, then an unpredictable and undesired operation of the digital circuit may occur, including possible latch-up problems, etc. Such problems may not recover once the power supply voltage reaches its final value and stabilizes.

Accordingly, it is common to provide a power-on reset circuit for a digital circuit to provide a reset signal to the digital circuit to reset the digital circuit to a known state once the power supply voltage reaches a desired threshold voltage level. Such a power-on reset circuit typically includes a delay circuit connected to the power supply voltage to provide a delayed reset signal that will only reach a reset threshold voltage level to reset the digital circuit(s) after the power supply voltage reaches a desired power supply voltage threshold level.

Figure 1:
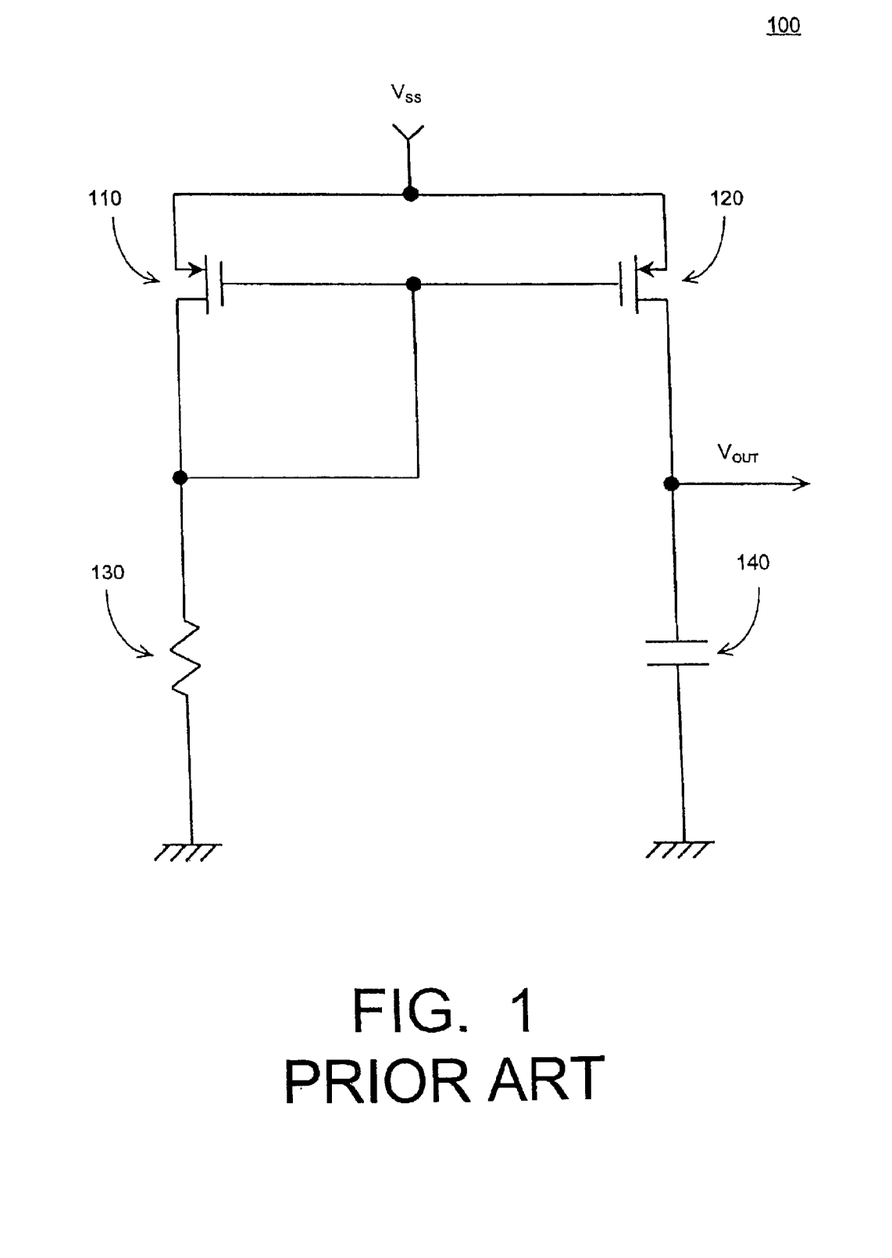
FIG. 1 shows an input stage of a conventional power-on reset circuit.

FIG. 1 illustrates the input stage 100 of a conventional power-on reset circuit. The input stage 100 includes first and second PMOS transistors 110 and 120, resistor 130, and capacitor 140. The power supply voltage is indicated as $V_{SS}$ and the output signal is indicated as $V_{OUT}$. The input stage 100 is followed by a second stage, typically a Schmidt trigger, to provide a power-on reset signal to the remaining digital circuits as will be described in more detail below.

The input stage 100 can be modeled as a current source connected in series with the capacitor 140. The current source is established by the current mirror relationship of first and second PMOS transistors 110 and 120. The output signal $V_{OUT}$ is a ramp signal whose slope is determined by the current of the current source and the capacitance of the capacitor 140. The $V_{OUT}$ ramp signal is provided to a second stage, typically a Schmidt trigger, having a threshold to convert the $V_{OUT}$ ramp signal into a $V_{RESET}$ pulse signal having a sharp transition edge.

Because of the current mirror, a power-on reset circuit having the input stage 100 can produce a reset signal $V_{RESET}$ with a much higher delay for the same values of resistor 130 and capacitor 140 compared to a power-on reset circuit whose input stage is a simple RC delay circuit. For example, if the current mirror scales down the current through the capacitor 140 by a factor of ten (10), then the resulting delay will be scaled up by about the same factor of 10 compared to an RC delay circuit having the same size capacitor. This can be especially beneficial when the power-on reset circuit having the input stage 100 is incorporated into a digital integrated circuit (IC) device where space considerations are very important.

Unfortunately, there are problems with the conventional power-on reset circuit having the input stage 100. For example, once the power-on reset circuit has performed its principle function (providing a delayed reset signal upon power-up), there remains a DC static current through the circuit by means of the current through the current mirror transistor 110 and the resistor 130. As a result, the power-on reset circuit will needlessly consume and waste power even in its "standby" mode of operation.

One solution to the above-mentioned problem has been disclosed in U.S. Pat. No. 6,052,006. However, the disclosed solution requires more than five additional transistors to stop the current flow through the power-on reset circuit once the circuit has performed its principle function.

Accordingly, it would be desirable to provide an improved power-on reset circuit, and in particular, a power-on reset circuit having an improved input stage. It would also be desirable to provide a power-on reset circuit that consumes very little, if any, power in a standby mode. It would be further desirable to provide a power-on reset circuit that eliminates static DC current flow through the circuit during a standby mode. It would be still further desirable to provide a power-on reset circuit that includes a less complicated means of eliminating static DC current flow through the circuit during a standby mode. The present invention is directed to addressing one or more of the preceding concerns.

In one aspect of the invention, a power-on reset circuit comprises a current mirror connected to a first power supply voltage, a capacitor receiving current from the current mirror, and current shutoff means connected between the current mirror and a second power supply voltage, the current shutoff means being adapted to shut off the current received by the first capacitor when a voltage across the capacitor reaches a threshold voltage level.

In another aspect of the invention, a semiconductor device includes a digital circuit having a reset input and power-on reset circuit providing a reset signal to the reset input, the power-on reset circuit comprising a current mirror connected to a first power supply voltage, a first capacitor receiving current from the current mirror, and current shutoff means connected between the current mirror and a second power supply voltage, the current shutoff means being adapted to shut off the current received by the first capacitor when a voltage across the capacitor reaches a threshold voltage level.

DETAILED DESCRIPTION

Figure 2:
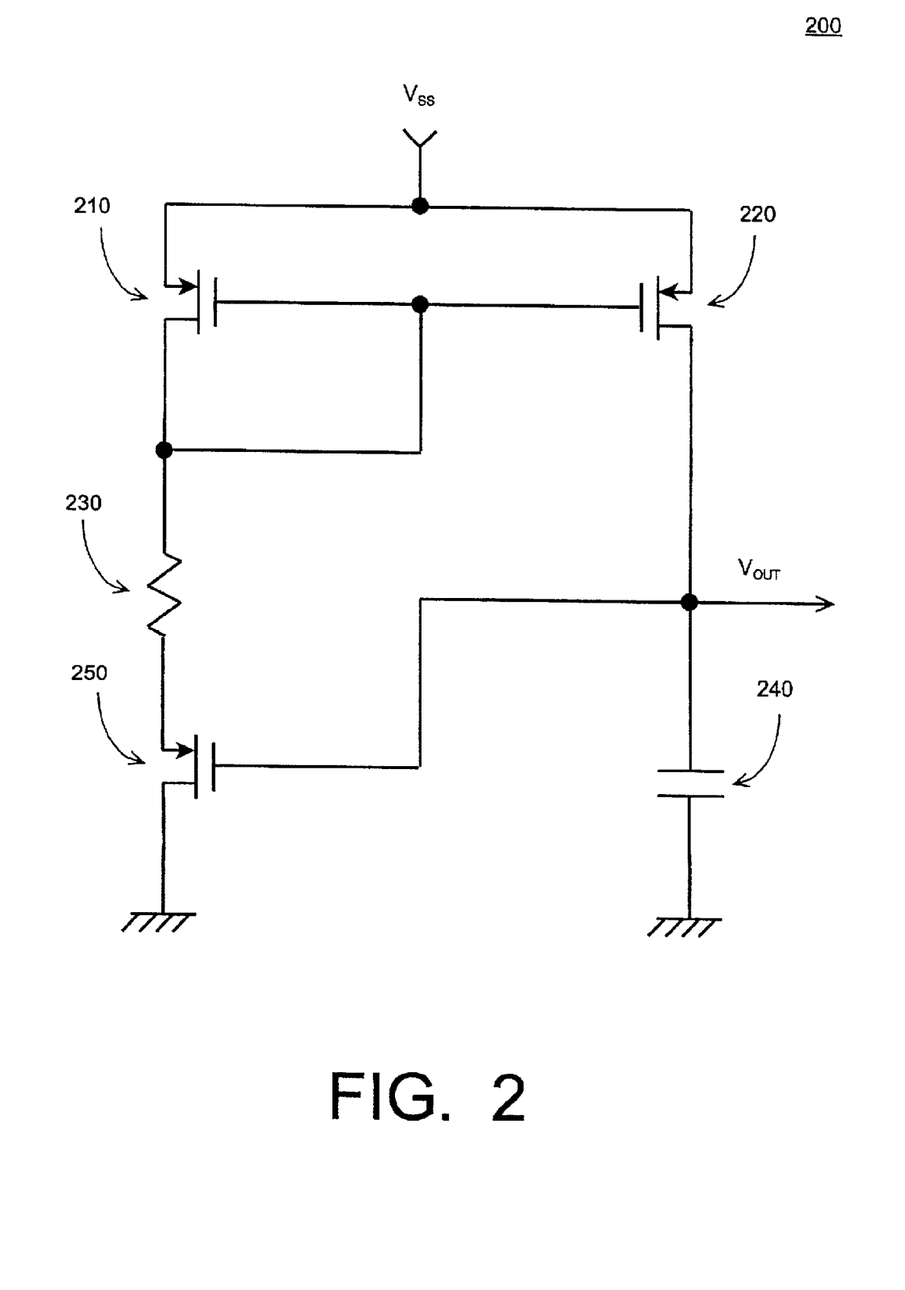
FIG. 2 shows a first embodiment of an input stage of a power-on reset circuit according to one or more aspects of the invention.

FIG. 2 shows a first embodiment of an input stage 200 of a power-on reset circuit according to one or more aspects of the invention. The power-on reset circuit input stage 200 includes: a current mirror comprising first and second PMOS transistors 210 and 220, resistor 230, capacitor 240, and current shutoff means comprising a third PMOS transistor 250. The power supply voltage is indicated as $V_{SS}$ and the output signal is indicated as $V_{OUT}$. Although the exemplary power-on reset circuit input stage 200 is shown being connected between the power supply voltage $V_{SS}$ and a ground voltage, more generally the power-on reset circuit input stage 200 could be thought off as being connected between first and second power supply voltages or terminals. The input stage 200 of the power-on reset circuit is followed by a second stage, typically a Schmidt trigger, to provide a power-on reset signal to the remaining digital circuits as will be described in more detail below.

Beneficially, the power-on reset circuit input stage 200 is included in a semiconductor device having a digital integrated circuit, such as a memory device.

An explanation of the operation of a power-on reset circuit including the first embodiment input stage 200 will now be provided. A current source comprising the current mirror and the resistor 230 supplies current to charge a voltage across the capacitor 240, which voltage is the output voltage $V_{OUT}$ supplied by the power-on reset circuit input stage 200. When the output voltage charges up to a threshold voltage level, the current shutoff means comprising the third PMOS transistor 250 is activated to thereby shut off the current source supplying current to the capacitor 240, as the power-on reset circuit enters the standby mode.

More specifically, the power-on reset circuit input stage 200 receives the power supply voltage $V_{SS}$ from the power supply, and provides a ramp output signal $V_{OUT}$ to a second stage of the power-on reset circuit. Upon Power-up, the power supply voltage $V_{SS}$ begins to ramp up to its final value (e.g., 3 volts); At this point, the transistor 220 starts to turn on, thereby turning on the transistor 210 and the transistor 250. Current flows through the series path comprising transistors 210 and 250 and resistor 230. Through the current mirror a reduced current also flows through the series combination of the transistor 220 and capacitor 240, charging the voltage on the capacitor 240, which is $V_{OUT}$. The voltage $V_{OUT}$ is provided to the second stage, typically a Schmidt trigger, having a threshold to convert the $V_{OUT}$ ramp signal into a $V_{RESET}$ pulse, signal having a sharp transition edge.

As the voltage $V_{OUT}$ charges up (ramps up), feedback begins to turn off the transistor 250. When the capacitor 240 is almost completely charged to its final value, the current source goes into sub-threshold conduction. When the capacitor 240 is completely charged, the transistor 250 blocks the DC current path through the transistor 210 and resistor 230. Also beneficially, the transistor 250 drains some of the current through the transistor 220 at start-up, increasing the threshold of the power supply voltage level at which the capacitor 240 starts to charge. This provides for either a longer delay, or the ability to use a slightly smaller capacitor 240 (less area).

Figure 3:
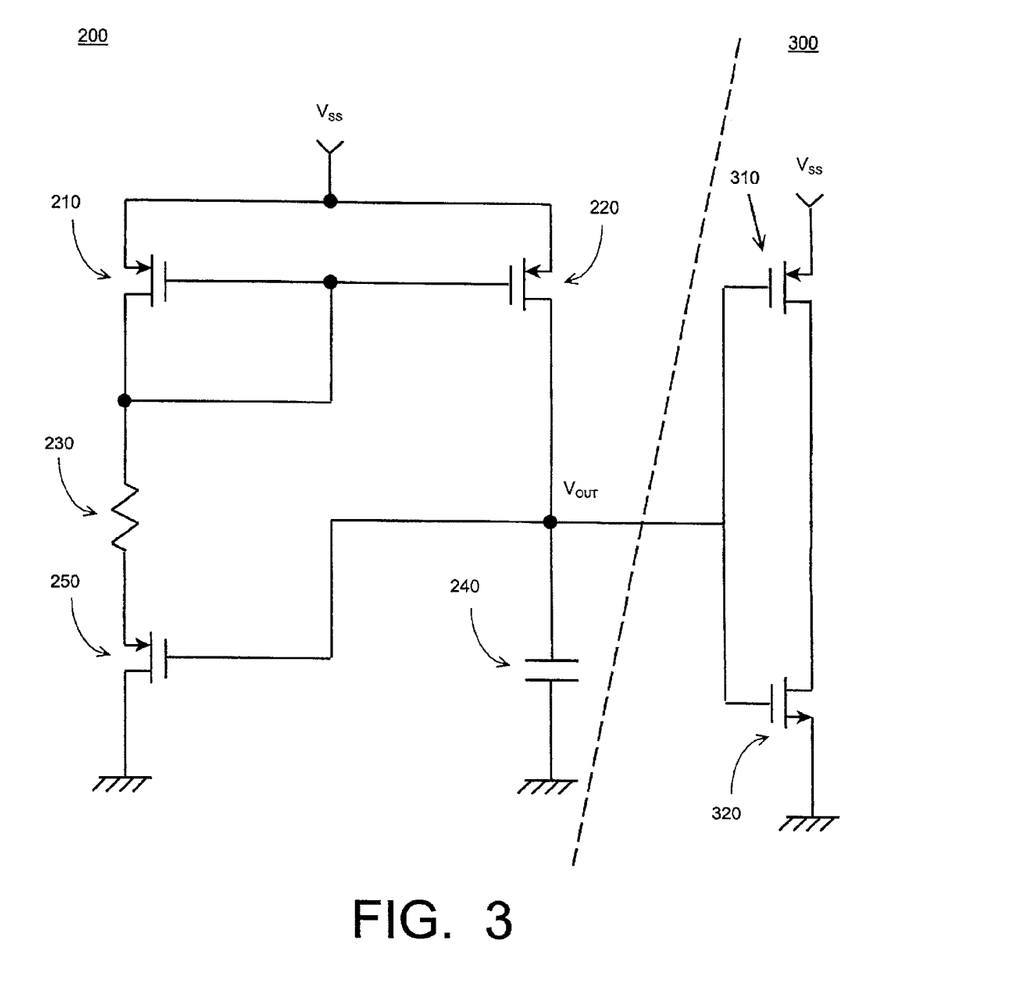
FIG. 3 shows the circuit of FIG. 2 connected to an input of a second stage of the power-on reset circuit.

FIG. 3 shows the input stage 200 of a power-on reset circuit connected to an input of a second stage 300, such as a Schmidt trigger circuit, for converting the ramp-like VOUT signal to a pulse-like reset signal for resetting digital circuits. The input of the second stage 300 includes a PMOS transistor 310 connected in series with an NMOS transistor 320. In this case, it can be seen that the voltage across the capacitor 240, $V_{OUT}$, does not completely charge up to the supply voltage $V_{SS}$. As a result of this, a voltage drop occurs across the gate and source of the PMOS transistor 310 of the digital circuit 300, causing a current to flow through the PMOS transistor 310 while the power-on reset circuit is in the standby mode.

Figure 4:
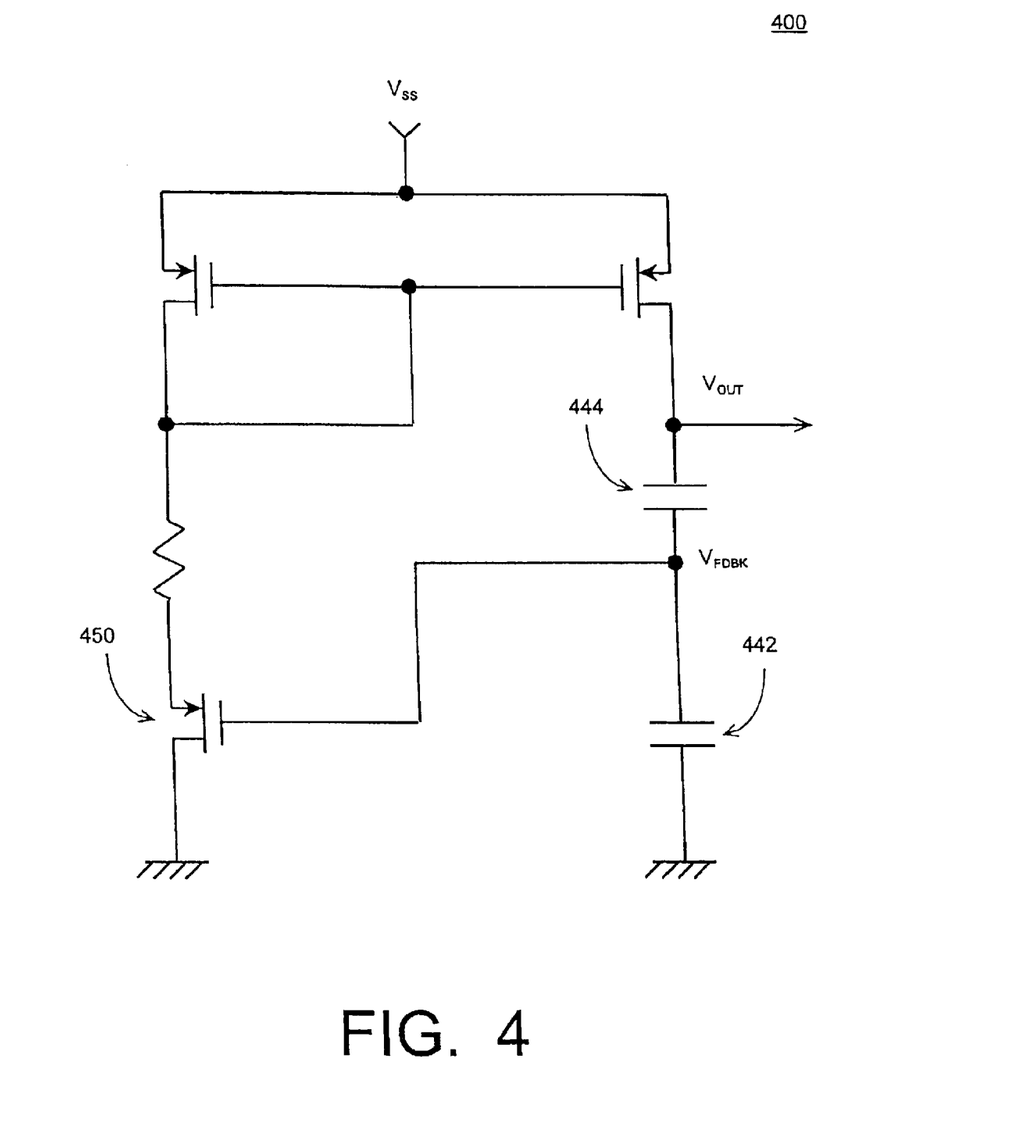
FIG. 4 shows a second embodiment of an input stage of a power-on reset circuit according to one or more aspects of the invention.

Accordingly, to address this drawback, a second embodiment power-on reset circuit input stage 400 shown in FIG. 4 includes a series combination of two capacitors 442 and 444. The feedback voltage to the current shutoff means comprising the third PMOS transistor 450, $V_{FDBK}$, is based on the voltage charged onto capacitor 442, while the output voltage $V_{OUT}$ is based on the voltage across the series combination of capacitors 442 and 444. Advantageously, in the power-on reset circuit 400, the output voltage $V_{OUT}$ gets almost completely charged before the feedback voltage $V_{FDBK}$ turns off the current source. This ensures that the PMOS transistor 310, for example, of a second stage of the power-on reset circuit is not left conducting when the power-on reset circuit is in the standby mode.

In the power-on reset circuit input stage 400, the two capacitors 442 and 444 are connected in series so as to reduce the total capacitance into which the current through transistor 420 charges. In order to achieve the same power-on reset delay as for the power-on reset circuit including the input stage 200, each of the capacitors 442 and 444 will need to be larger than the capacitor 240 of power-on reset circuit input stage 200. Disadvantageously, these larger capacitors occupy a greater area in an integrated circuit, requiring a greater area for the power-on reset circuit input stage 400 compared with the power-on reset circuit input stage 200 to achieve the same power-on reset delay.

Figure 5:
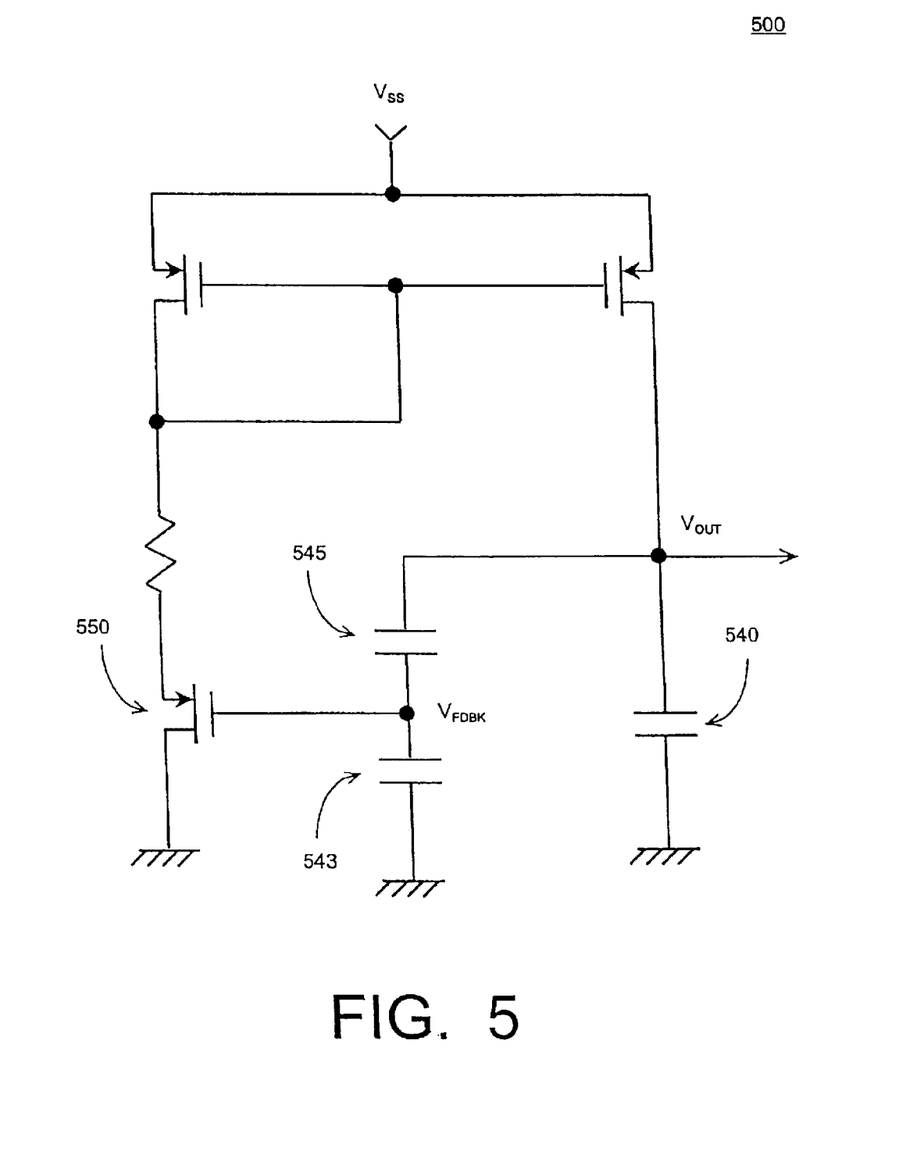
FIG. 5 shows a third embodiment of an input stage of a power-on reset circuit according to one or more aspects of the invention.

Accordingly, to address this drawback, a third embodiment power-on reset circuit input stage 500 shown in FIG. 5 includes a series combination of two capacitors 543 and 545 together in parallel with the capacitor 540. In similarity to FIG. 4, the feedback voltage to the current shutoff means comprising the third PMOS transistor 550, $V_{FDBK}$, is based on the voltage charged onto capacitor 543, while the output voltage $V_{OUT}$ is provided by the voltage across the series combination of capacitors 543 and 545. Advantageously, in the power-on reset circuit input stage 500, the output voltage $V_{OUT}$ gets almost completely charged before the feedback voltage $V_{FDBK}$ turns off the current source. This ensures that the PMOS transistor 310, for example, of a second stage of the power-on reset circuit is not left conducting when the power-on reset circuit is in the standby mode. Also advantageously, the capacitors 543 and 545 can be very small compared with the capacitor 540, leaving the delay and the total area required for the power-on reset circuit largely unaffected.

Figure 6:
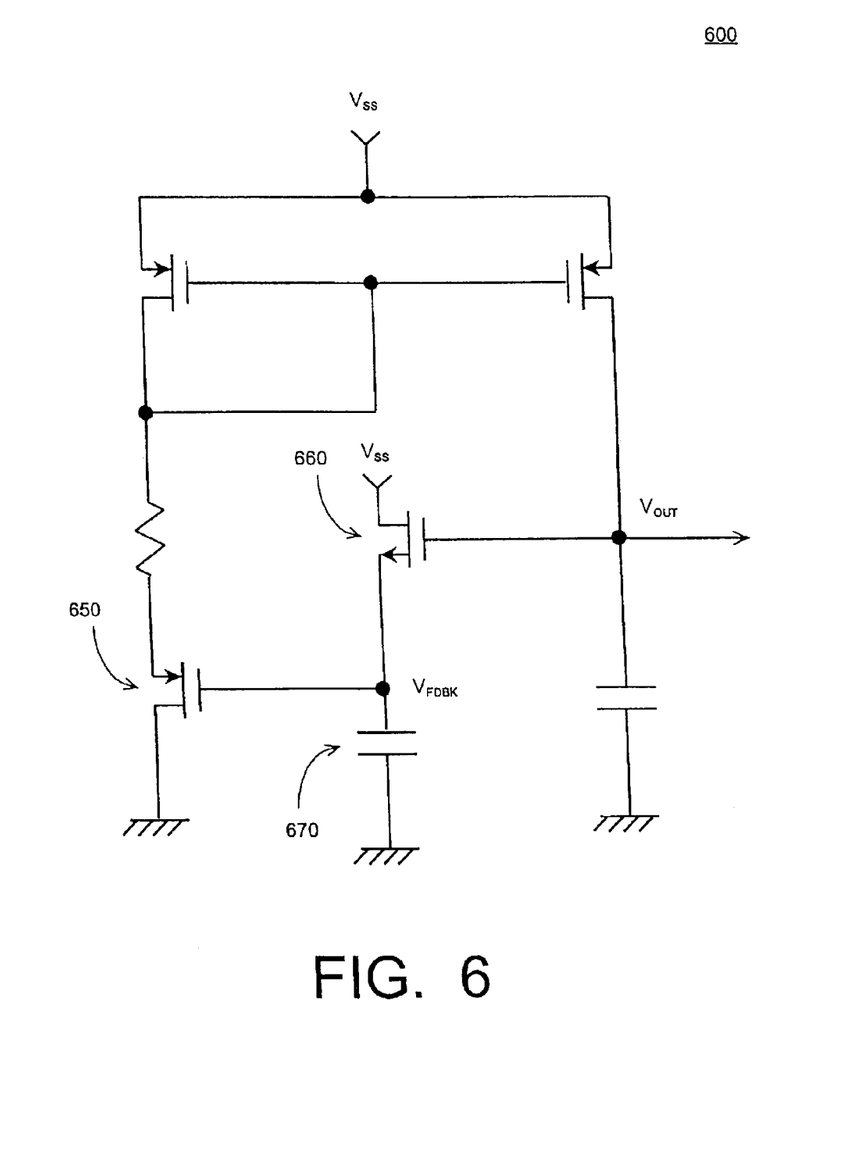
FIG. 6 shows a fourth embodiment of an input stage of a power-on reset circuit according to one or more aspects of the invention.

Alternatively, in a fourth embodiment power-on reset circuit input stage 600 shown in FIG. 6, instead of the capacitor 545, an NMOS transistor 660 is used to provide the feedback voltage $V_{FDBK}$ to the current shutoff means comprising the third PMOS transistor 650. As in the second and third embodiments, in the fourth embodiment power-on reset circuit input stage 600, the output voltage $V_{OUT}$ gets almost completely charged before the feedback voltage $V_{FDBK}$ turns off the current source. Also, since the capacitor 670 can be very small, the overall area of the circuit is almost unaffected.

Figure 7:
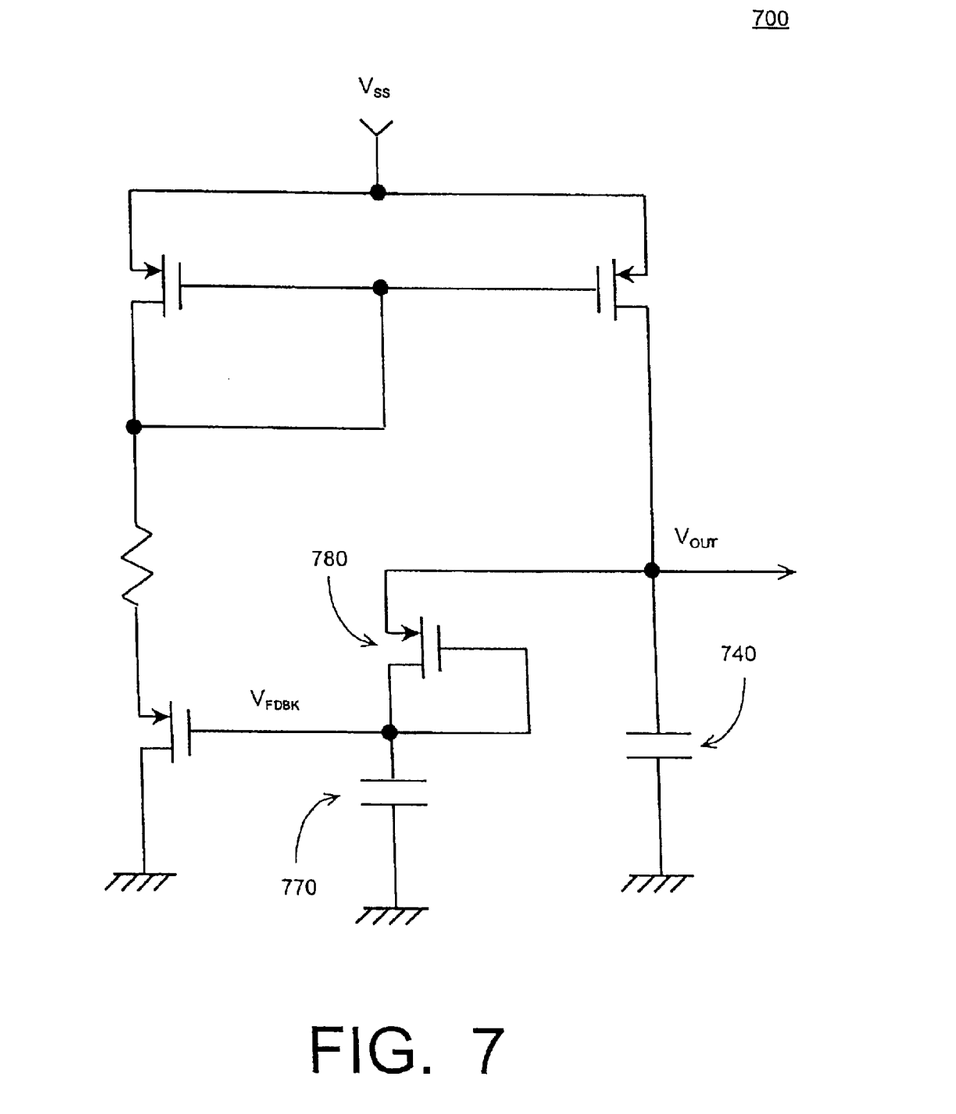
FIG. 7 shows a fifth embodiment of an input stage of a power-on reset circuit according to one or more aspects of the invention.

FIG. 7 shows a fifth embodiment power-on reset circuit input stage 700. The fifth embodiment power-on reset circuit input stage 700 is similar to the fourth embodiment power-on reset circuit input stage 600, except the NMOS transistor 660 is replaced by a diode-connected fourth PMOS transistor 780, taking its charge from the capacitor 740 instead of the first power supply. This eliminates the effect of any differences between the threshold voltages of the NMOS and PMOS transistors in FIG. 6, and effectively adds the capacitance of the smaller capacitor 770 to that of the larger capacitor 740, allowing the size of capacitor 740 to be correspondingly reduced, or increasing the delay of the power-on reset circuit 700.

While preferred embodiments are disclosed herein, many variations are possible which remain within the concept and scope of the invention. Such variations would become clear to one of ordinary skill in the art after inspection of the specification, drawings and claims herein. The invention therefore is not to be restricted except within the spirit and scope of the appended claims.

What is claimed is:

1. A power-on reset circuit input stage, comprising:

first and second transistors each having first and second terminals and a control terminal, the first terminal of each of the first and second transistors being connected to a first power supply voltage, and the control terminals of the first and second transistors being connected to each other and to the second terminal of the first transistor;

a first capacitor connected between the second terminal of the second transistor and a second power supply voltage;

a third transistor having first and second terminals and a control terminal, the second terminal of the third transistor being connected to the second power supply voltage;

a resistor connected between the second terminal of the first transistor and the first terminal of the third transistor; and a second capacitor that is one of (1) directly connected in series between the second terminal of the second transistor and the first capacitor and (2) connected between the control terminal of the third transistor and the second power supply terminal, wherein the control terminal of the third transistor is adapted to respond to a voltage across the first capacitor to selectively turn on and turn off the third transistor and a current charging the first capacitor.

2. A power-on reset circuit input stage, comprising:

first and second transistors each having first and second terminals and a control terminal, the first terminal of each of the first and second transistors being connected to a first cower supply voltage, and the control terminals of the first and second transistors being connected to each other and to the second terminal of the first transistor;

a first capacitor connected between the second terminal of the second transistor and a second power supply voltage;

a third transistor having first and second terminals and a control terminal, the second terminal of the third transistor being connected to the second cower supply voltage; and a resistor connected between the second terminal of the first transistor and the first terminal of the third transistor, wherein the control terminal of the third transistor is adapted to respond to a voltage across the first capacitor to selectively turn on and turn off the third transistor and a current charging the first capacitor, and wherein the control terminal of the third transistor is connected to the second terminal of the second transistor and the first capacitor.

3. A power-on reset circuit input stage, comprising:

first and second transistors each having first and second terminals and a control terminal, the first terminal of each of the first and second transistors being connected to a first power supply voltage, and the control terminals of the first and second transistors being connected to each other and to the second terminal of the first transistor;

a first capacitor connected between the second terminal of the second transistor and a second power supply voltage;

a third transistor having first and second terminals and a control terminal, the second terminal of the third transistor being connected to the second power supply voltage; and a resistor connected between the second terminal of the first transistor and the first terminal of the third transistor, wherein the control terminal of the third transistor is adapted to respond to a voltage across the first capacitor to selectively turn on and turn off the third transistor and a current charging the first capacitor, and wherein the first, second end third transistors are PMOS transistors.

4. The power-on reset circuit input stage of claim 1, wherein the second capacitor is directly connected in series between the second terminal of the second transistor and the first capacitor.

5. The power-on reset circuit input stage of claim 4, further comprising a third capacitor in parallel with the series-connected first and second capacitors.

6. The power-on reset circuit input stage of claim 1, wherein the second capacitor is connected between the control terminal of the third transistor and the second power supply terminal, and further comprising:

a fourth transistor having a first terminal connected to the control terminal of the third transistor and the second capacitor, a second terminal connected to the first power supply voltage, and a control terminal connected to the second terminal of the second transistor and the first capacitor.

7. The power-on reset circuit input stage of claim 1, wherein the second capacitor is connected between the control terminal of the third transistor and the second power supply terminal, and further comprising:

a fourth transistor having a first terminal connected to the second terminal of the second transistor and the first capacitor, and a second terminal and control terminal connected to the control terminal of the third transistor and the second capacitor.

8. A power-on reset circuit input stage, comprising:

a first capacitor;

a current source supplying current to the first capacitor and producing therefrom an output voltage, the current source comprising, a current mirror having a first terminal connected to a first power supply voltage, current shutoff means for shutting off the current supplied to the first capacitor when a voltage across the first capacitor reaches a threshold voltage level, and a resistor connected between the current mirror and the current shutoff means; and a second capacitor that is one of (1) connected in series with the first capacitor between the current mirror and a second power supply voltage, (2) connected between a control terminal of the current shutoff means and the second power supply voltage, and (3) connected between the output voltage and the control terminal of the current shutoff means.

9. The power-on reset circuit input stage of claim 8, wherein the current shutoff means comprises a transistor.

10. The power-on reset circuit input stage of claim 9, wherein the transistor has a control terminal connected to the output voltage.

11. The power-on reset circuit input stage of claim 8, wherein the second capacitor is connected in series with the first capacitor between the current mirror and the second power supply voltage.

12. The power-on reset circuit input stage of claim 8, wherein the current shutoff means comprises:
 a first transistor connected between the resistor and the second power supply voltage and having a control terminal adapted to selectively turn on and turn off the first transistor and the current supplied to the first capacitor; and
 a second transistor connected between the first power supply voltage and the control terminal of the first transistor and having a control terminal connected to the output voltage,
 wherein the second capacitor is connected between the control terminal of the first translator and the second power supply voltage.

13. The power-on reset circuit input stage of claim 8, wherein the current shutoff means comprises:
 a first transistor connected between the current mirror and the second power supply voltage and having a control terminal adapted to selectively turn on and turn off the first transistor and the current supplied to the first capacitor;
 a second transistor connected between the output voltage and the control terminal of the first transistor and having a control terminal connected to the control terminal of the first transistor,
 wherein the second capacitor is connected between the control terminal of the first current shutoff means and the second power supply voltage.

14. The power-on reset circuit input stage of claim 8, wherein the current shutoff means comprises:
 a transistor connected between the resistor and a second power supply voltage and having a control terminal adapted to selectively turn on and turn off the transistor and the current supplied to the first capacitor; and
 a third capacitor connected between the control terminal of the transistor and the second power supply voltage,
 wherein the second capacitor is connected between the output voltage and the control terminal of the transistor.

15. The power-on reset circuit input stage of claim 8, wherein the current mirror comprises first and second PMOS transistors.

16. A power-on reset circuit, comprising:
 a current mirror connected to a first power supply voltage;
 a first capacitor receiving current from the current mirror;
 current shutoff means connected between the current mirror and a second power supply voltage, the current shutoff means being adapted to shut off the current received by the first capacitor when a voltage across the first capacitor reaches a threshold voltage level; and
 a second capacitor that is one of (1) connected in series with the first capacitor between the current mirror and the second power supply voltage, (2) connected between the control terminal of the first transistor and the second power supply voltage, and (3) connected between the first capacitor and the control terminal of the transistor.

17. The power-on reset circuit of claim 16, wherein the current shutoff means comprises a transistor.

18. The power-on reset circuit at claim 17, wherein the transistor has a control terminal connected to the first capacitor.

19. The power-on reset circuit of claim 16, wherein the second capacitor is connected in series with the first capacitor between the current mirror and the second power supply voltage.

20. The power-on reset circuit of claim 16, wherein the current shutoff means comprises:
 a first transistor connected between the current mirror and the second power supply voltage and having a control terminal adapted to selectively turn on and turn off the first transistor and the current received by the first capacitor; and
 a second transistor connected between the first power supply voltage and the control terminal of the first transistor and having a control terminal connected to the first capacitor,
 wherein the second capacitor is connected between the control terminal of the first transistor and the second power supply voltage.

21. The power-on reset circuit of claim 16, wherein the current shutoff means comprises:
 a first transistor connected between the current mirror and the second power supply voltage and having a control terminal adapted to selectively turn on and turn off the first transistor and the current received by the first capacitor;
 a second transistor connected between the first capacitor and the control terminal of the first transistor and having a control terminal connected to the control terminal of the first transistor,
 wherein the second capacitor is connected between the control terminal of the first transistor and the second power supply voltage.

22. The power-on reset circuit of claim 16, wherein the current shutoff means comprises:
 a transistor connected between the current mirror and the second power supply voltage and having a control terminal adapted to selectively turn on and turn off the transistor and the current received by the first capacitor; and
 a third capacitor connected between the control terminal of the transistor and the second power supply voltage,
 wherein the second capacitor is connected between the first capacitor and the control terminal of the transistor.

23. The power-on reset circuit of claim 16, wherein the current mirror comprises first and second PMOS transistors.

24. A semiconductor integrated circuit, comprising:
 a digital circuit having a reset input;
 a power-on reset circuit, comprising
  an input stage, including:
   a current mirror connected to a first power supply voltage,
   a first capacitor receiving current from the current mirror and providing an output signal, and current shutoff means connected between the current mirror and a second power supply voltage, the current shutoff means being adapted to shut off the current received by the first capacitor when a voltage across the first capacitor reaches a threshold voltage level, and an output stage, including means for converting the output signal into a reset signal applied to the reset input; and a second capacitor that is one of (1) connected in series with the first capacitor between the current mirror and the second power supply voltage, (2) connected between a control terminal of the current shutoff means and the second power supply voltage, and (3) connected between the first capacitor and the control terminal of the transistor.

25. The semiconductor integrated circuit of claim 24, wherein the current shutoff means comprises a transistor.

26. The semiconductor integrated circuit of claim 25 wherein the transistor has a control terminal connected to the first capacitor.

27. The semiconductor integrated circuit of claim 24, wherein the second capacitor is connected in series with the first capacitor between the current mirror and the second power supply voltage.

28. The semiconductor integrated circuit of claim 24, wherein the current shutoff means comprises:

a first transistor connected between the current mirror and the second power supply voltage and having a control terminal adapted to selectively turn on and turn off the first transistor and the current received by the first capacitor; and a second transistor connected between the first power supply voltage and the control terminal of the first transistor and having a control terminal connected to the first capacitor, wherein the second capacitor is connected between the control terminal of the first transistor and the second power supply voltage.

29. The semiconductor integrated circuit of claim 24, wherein the current shutoff means comprises:

a first transistor connected between the current mirror and the second power supply voltage and having a control terminal adapted to selectively turn on and turn off the first transistor and the current received by the first capacitor; and a second transistor connected between the first capacitor and the control terminal of the first transistor and having a control terminal connected to the control terminal of the first transistor, wherein the second capacitor is connected between the control terminal of the first transistor and the second power supply voltage.

30. The semiconductor integrated circuit of claim 24, wherein the current shutoff means comprises:

a transistor connected between the current mirror and the second power supply voltage and having a control terminal adapted to selectively turn on and turn off the transistor and the currant received by the first capacitor; and a third capacitor connected between the control terminal of the transistor and the second power supply voltage, wherein the second capacitor is connected between the first capacitor and the control terminal of the transistor.

31. The semiconductor integrated circuit of claim 24, wherein the output stage comprises a Schmidt trigger.

* * * * *